(12) United States Patent
Parikh et al.

(10) Patent No.: US 8,793,626 B2
(45) Date of Patent: Jul. 29, 2014

(54) COMPUTATIONAL LITHOGRAPHY WITH FEATURE UPSIZING

(71) Applicant: Texas Instruments Incorporated, Dallas, TX (US)

(72) Inventors: Ashesh Parikh, Frisco, TX (US); Chi-Chien Ho, Plano, TX (US); Thomas John Smelko, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/849,195

(22) Filed: Mar. 22, 2013

(65) Prior Publication Data

US 2013/0254723 A1 Sep. 26, 2013

Related U.S. Application Data

(60) Provisional application No. 61/614,951, filed on Mar. 23, 2012.

(51) Int. Cl.
*G06F 17/50* (2006.01)

(52) U.S. Cl.
USPC .......................................................... 716/50

(58) Field of Classification Search
USPC .................................................. 716/100, 50
See application file for complete search history.

(56) References Cited

U.S. PATENT DOCUMENTS

| 5,424,154 | A  | * | 6/1995  | Borodovsky ...................... 430/5 |
| 5,498,579 | A  | * | 3/1996  | Borodovsky et al. ........... 716/53 |
| 6,553,562 | B2 | * | 4/2003  | Capodieci et al. .............. 716/53 |
| 6,783,904 | B2 | * | 8/2004  | Strozewski et al. ............. 430/30 |
| 2002/0166107 | A1 | * | 11/2002 | Capodieci et al. .............. 716/19 |
| 2003/0213613 | A1 | * | 11/2003 | Strozewski et al. ........... 174/250 |
| 2011/0276935 | A1 | * | 11/2011 | Fouquet et al. ................ 716/112 |
| 2013/0183611 | A1 | * | 7/2013  | Finders ............................. 430/5 |
| 2013/0219348 | A1 | * | 8/2013  | Ye et al. .......................... 716/52 |
| 2013/0254724 | A1 | * | 9/2013  | Parikh ............................. 716/53 |

OTHER PUBLICATIONS

Youping Zhang, et al., "A Focus Exposure Matrix Model for Full Chip Lithography Manufacturability Check and Optical Proximity Correction", SPIE Proceedings, vol. 6283, Published May 3, 2006.

* cited by examiner

*Primary Examiner* — Suchin Parihar
(74) *Attorney, Agent, or Firm* — Jacqueline J. Garner; Frederick J. Telecky, Jr.

(57) ABSTRACT

A method of computational lithography includes providing through-focus critical dimension (CD) curves at a range of different focus values (Bossung curves) for a plurality of feature types that include different ratios of line width to space width. Using software run on a computing device, it is determined if there is at least one marginal feature type from the plurality of feature types based an image tool capability and a predetermined process specification affected by at least one of the plurality of feature types. Provided a marginal feature type is determined to be present, at least the marginal feature type(s) is upsized. A degree of upsizing increases as a curvature of the Bossung curves increases. A computational lithography model is compiled including the upsizing.

18 Claims, 6 Drawing Sheets

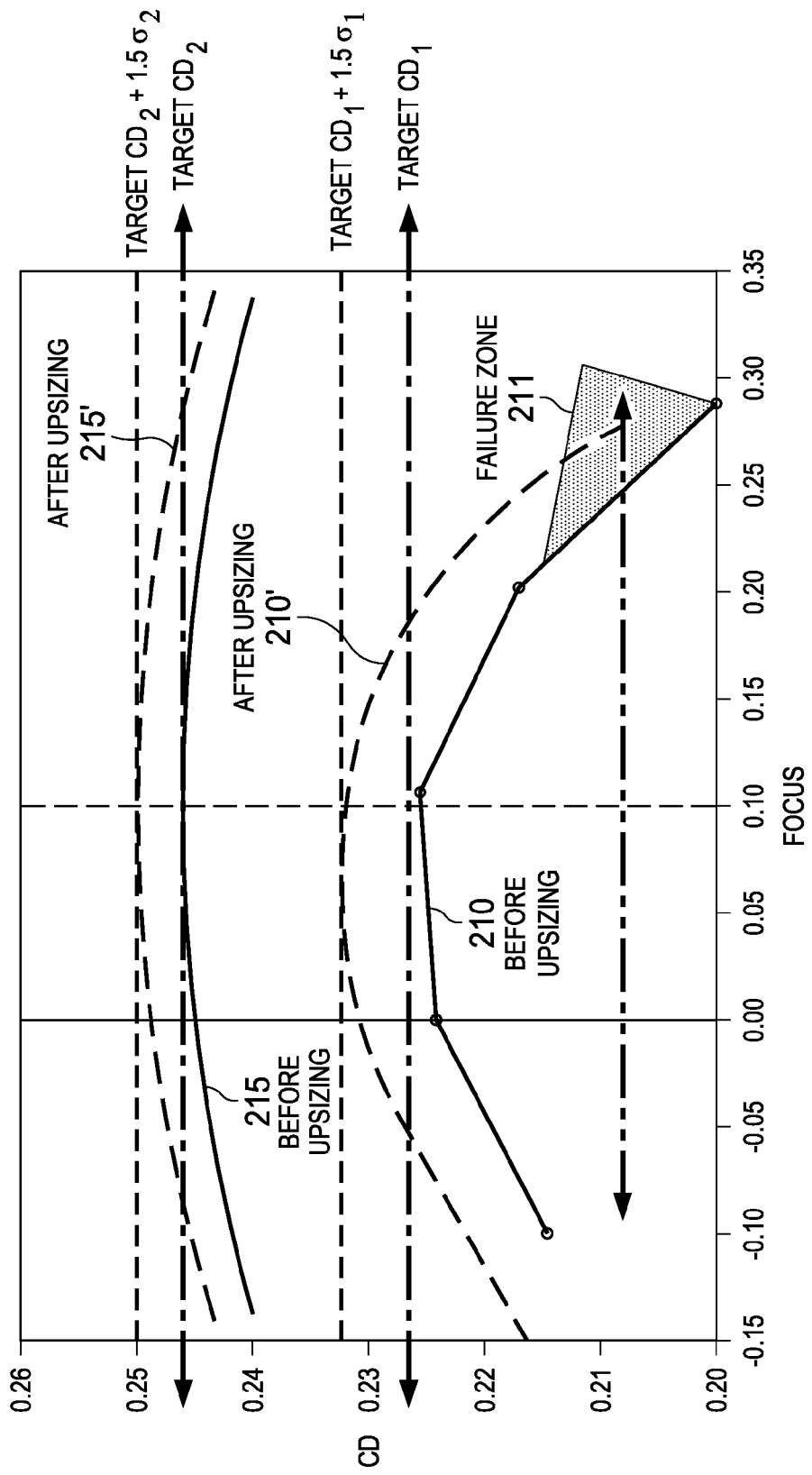

COMPUTATIONAL LITHOGRAPHY WITH FEATURE UPSIZING

CROSS REFERENCE TO RELATED APPLICATIONS

This application claims the benefit of Provisional Application Ser. No. 61/614,951 entitled "SYSTEM AND METHOD TO CREATE 1.5σ OPC", filed Mar. 23, 2012, which is herein incorporated by reference in its entirety.

FIELD

Disclosed embodiments relate to integrated circuits (ICs) including semiconductor fabrication, and more particularly to computation lithography for forming IC devices and IC devices therefrom.

BACKGROUND

Optical proximity correction (OPC) is a photolithography enhancement technique commonly used to compensate for image errors due to diffraction effects or process effects. OPC is needed mainly in the making of semiconductor devices and is due to the limitations of electromagnetic radiation to maintain the edge placement integrity of the original design, after processing, into the etched feature on the wafer. These projected images appear with irregularities such as line widths that are narrower or wider than designed, and are amenable to OPC compensation by changing the pattern on the photomask (or reticle) used for the imaging.

OPC corrects these errors by moving edges or adding extra polygons to the pattern written on the photomask. This may be driven by pre-computed look-up tables based on width and spacing between the features (known as rule-based OPC), or by using compact models to dynamically simulate the final pattern and thereby drive the movement of edges, typically broken into sections, to find the best solution. The objective is to reproduce, as well as possible, the original IC layout drawn by the IC designer into features etched on the die of the wafer.

The workhorse to enable sub-wavelength lithography is referred to as computational lithography (CL). CL makes use of numerical simulations to improve the performance (resolution and contrast) provided by cutting-edge reticles. CL combines techniques including Resolution Enhancement Technology (RET), OPC, and some non-optical portions. Beyond the models used for RET and OPC, CL can include the signature of the scanner to help improve the accuracy of the OPC model, polarization characteristics of the lens pupil, a Jones matrix of the stepper lens, optical parameters of the resist stack, and diffusion through the resist.

For example, in the sub-wavelength lithography era, off-axis illumination such as Annular and Quadropole has been used to print high density features. While the process margin for certain features has been improved, other features notably line-ends and corners, suffer from high sensitivity to focus variation, and thus have a low depth of focus (DOF) which is also known as the depth of field. DOF is the range of distances in object space for which object points are imaged with acceptable sharpness with a fixed position of the image plane. OPC corrects for size only, as it only adjusts the reticle/mask to bring the feature to the designed size at the best focus and dose conditions.

SUMMARY

Disclosed embodiments recognize integrated circuits (ICs) manufactured using sub-wavelength lithography and conventional computational lithography (CL) including optical proximity correction (OPC) are subject to high parametric variability due to lower process margins that can cause yield loss including shifted parameters (e.g., capacitance, resistance, drive current), as well as open and short circuits. Differential sensitivity of focus variation (reflected in Bossung curves) for different feature types is also recognized by disclosed embodiments, with smaller focus sensitivity of CDs for dense feature types and more focus sensitivity for CDs of isolated feature types, where high-frequency features such as line ends are also found to be generally more focus sensitive. CL models with feature upsizing is described herein that includes identifying if any of the feature types are "marginal" feature types, and if there are marginal feature(s) present, upsizing at least the marginal feature types which enables re-centering the parametric data associated with the marginal feature types. The features can be spaces or lines, where in the case of spaces for the features, disclosed upsizing results in the thinning of the lines.

Marginal feature types can be defined as feature types which have Bossung curves that include CD data beyond a predetermined variance (or error) relative to a nominal CD value. Disclosed feature upsizing is operable to reduce parametric the failures at the lower end of the parametric specification, such as resistance, capacitance, or drive current.

As used herein, the term "feature type" refers to the ratio of line width to space width in a given pattern portion (from a grating having repetitive lines and/or spaces on a reticle) of a lithography level, with each different feature type having a different ratio of line width to space width. Different feature types thus provide different pattern densities with resulting different optical interference effects. Different feature types may provide different pitches, defined in the art as the period of the grating. The artisan with ordinary skill in the art will appreciate that the term "mask" and "reticle", should be considered to be equivalent.

Disclosed embodiments include methods of CL including providing data from a plurality of different feature types which include different ratios of line width to space width to provide through-data CD data curves (Bossing curves having CD data at a range of different focus values). Marginal feature type(s) are determined to see if present from the plurality of feature types based an image tool capability, and a predetermined process specification affected by at least one of the plurality of feature types. Image tool capability generally includes dipole center sigma, focus blur (focus blur nominally refers to deviation from ideal image due to finite laser band-width, vertical mechanical vibration and/or reticle wafer stage tilt), source shape, numerical aperture (NA), and lens aberration. The predetermined process specification can comprise an electrical parameter (e.g., drive current for a MOS transistor), a CD distribution (e.g., CD size range or σ), or a depth of field (DOF).

If at least one marginal feature type is identified, at least the marginal feature type(s) are upsized in the design. In another embodiment, all of the feature types in the design are upsized. More sensitive feature types reflected in their Bossung curves are upsized more than less sensitive feature types by upsizing by a fixed amount relative to their σ reflected in their respective Bossung curves. A CL model is compiled including the upsizing at least the marginal feature types, such as running the CL model in one particular embodiment at 1.5σ for the marginal features types' CD vs. focus distribution reflected in their Bossung curves. The method can further comprise performing CL using the CL model to design a reticle for at least one level for fabricating an integrated circuit (IC).

BRIEF DESCRIPTION OF THE DRAWINGS

Reference will now be made to the accompanying drawings, which are not necessarily drawn to scale, wherein:

FIG. 1A to FIG. 1C show for a first feature type CD vs. pitch curve, CD vs. focus (Bossung curves), and a circuit parameter including the first feature, respectively, while

FIG. 2A depicts a Bossung curve before disclosed feature upsizing (at the original target CD) and a distribution after disclosed feature upsizing shown upsized an example amount of $1.5\sigma$ that can be used to obtain the leftmost distribution shown in FIG. 1F, according to an example embodiment.

DETAILED DESCRIPTION

Figure 1A:
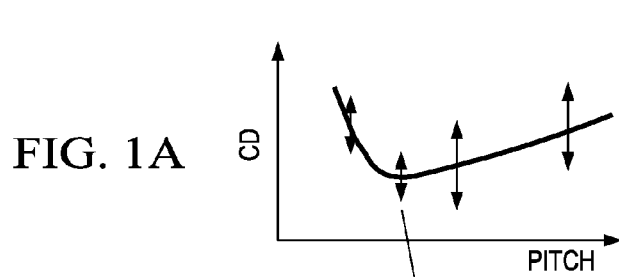

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 1B:
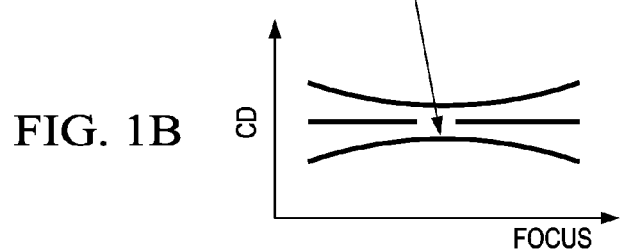
Figure 1C:
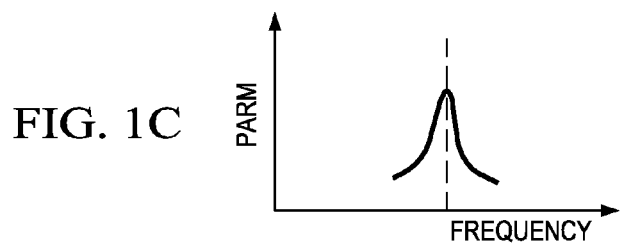

FIG. 1A to FIG. 1C show for a first feature type CD vs. pitch curve, CD vs. focus (a Bossung curve) and a circuit parameter affected by the first feature, respectively. The first feature may comprise a pattern of dense lines (e.g., line width 1 unit and spacing between lines 1.33 units). The Bossung curves in FIG. 1B show minimal CD variation with focus, so that the first feature type may be considered relatively insensitive to focus variation. The resulting circuit parameter distribution (as a function of frequency) is shown in FIG. 1C as "Parm" is Gaussian-like and is narrow.

The CD data at respective pitch values in the CD vs. pitch curve of FIG. 1A is shown by an arrow mapping into respective Bossung curves. The pitch values having smaller error bars (variance) have flatter (less sensitive) Bossung curves.

Figure 1D:
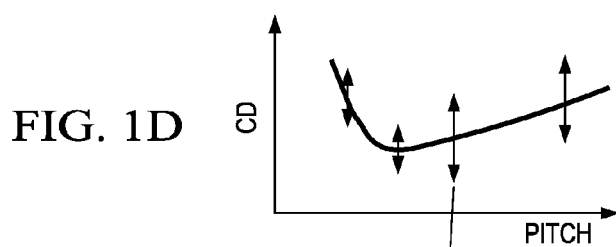
FIG. 1D to FIG. 1F show for a second feature type CD vs. pitch curve, CD vs. focus (Bossung curves), and a circuit parameter including the second feature, respectively.
Figure 1E:
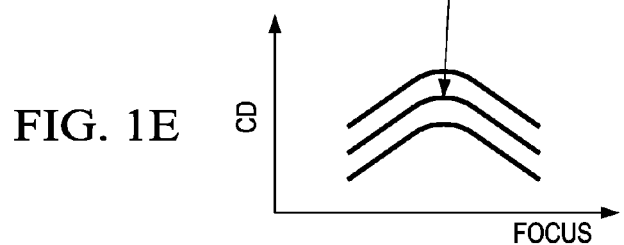
Figure 1F:
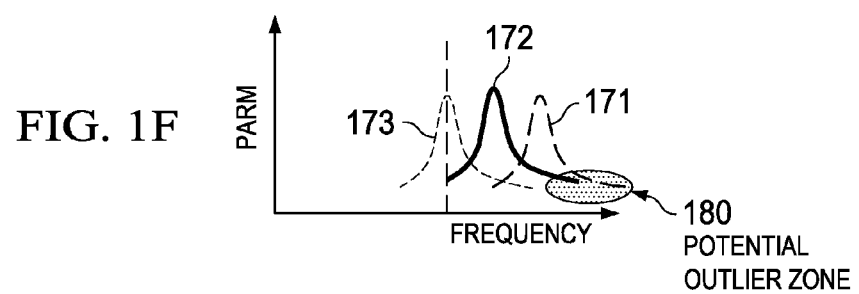

FIG. 1D to FIG. 1F show for a second feature type CD vs. pitch curve, CD vs. focus (a Bossung curve) and a circuit parameter affected by the second feature, respectively. The second feature type may be isolated lines (e.g. a line width 1 unit and spacing between lines of 10 units). The Bossung curves in FIG. 1E shows significant CD variation with focus, so that the second feature type may be considered relatively sensitive to focus variation. The resulting circuit parameter distribution (as a function of frequency) affected by the second feature type is shown in FIG. 1F as "Parm" has a long tail in contrast to a simple Gaussian-like distribution for the first feature type in FIG. 1C.

FIG. 1F shows three separate distributions for the circuit parameter affected by the second feature type, shown as 171, 172 and 173. Distribution 172 is an initial distribution for the parameter from a given reticle or set of reticles and a particular lithography tool that may be shifted to the right due to process variation to become distribution 171 (e.g., due to reticle variation). Both distribution 172 and distribution 171 include a tail extending to a region identified as a potential outlier zone 180 which may lead to failures of the parametric. Distribution 173 is a distribution resulting from disclosed upsizing of the features in the circuit which can be seen to result in centering the mean of the parameter affected by the second feature type to a nominal (e.g., designed) value shown in FIG. 1F as a vertical line, and as a result the tail of the distribution of the parameter to essentially no longer extend into the potential outlier zone 180.

FIG. 2A depicts example Bossung curve before disclosed upsizing for a first feature type 210 and a Bossung curves for a second feature type 215 centered at their original respective target CDs, shown as target $CD_1$ and target $CD_2$, and after disclosed feature upsizing to become upsized Bossung curves 210' and 215'. The original Bossung curves for a first feature type 210 can be seen to have a significantly larger variance ($\sigma$) as compared to a $\sigma$ of the second feature type 215, with the tail portion of the Bossung curve before disclosed upsizing for a first feature type 210 extending to a CD of around $\leq 0.21$ µm, which has been correlated by empirical parametric data to produce failures for the parameter when the CD of the second feature type is around $\leq 0.21$ µm. As a result, FIG. 2A identifies a failure zone for the Bossung curve before upsizing first feature type 210 for the tail portion extending to a CD of around $\leq 0.21$ µm.

Bossung curve before upsizing 210 may have a $3\sigma_1 = \pm 0.2$ µm, while the printing process (e.g., lithography tool and resist capability) for the first feature type may require $+/-0.3$ µm for successful and reliable printing of the first feature type, which results a significant portion of the right side of the CD distribution in Bossung curve 210 before upsizing being in the failure zone 211 shown, such as due to lifting resist, leading to outliers and thus parametric failures (e.g., opens or shorts). Using an example feature upsizing of $1.5\sigma$, this upsizing applied to the Bossung curve of the first feature type before upsizing 210 is shown to become upsized Bossung curve 210'.

After disclosed upsizing shown in upsized Bossung curves 210', the CDs are shown shifted upward to a $1.5\sigma_1$ target (i.e., use a $1.5\sigma_{o1}$ focus (off-focus) $C_{D1}$ target), so that the resulting upsized Bossung Curve 210' for the first feature shifts the right side of the CD distribution largely out of the failure zone 211, leading to elimination (or at least a significant reduction) of potential outliers (and thus parametric failures). This upsizing can correspond to the CD change (upsize) that provides distribution 173 of the parameter in FIG. 1F from distribution 172 of the parameter.

Bossung curve 215 for the second feature type may have a $3\sigma_2 = \pm 0.1$ μm, while the printing process may require +/−0.3 μm successful and reliable printing of the second feature type, which results a small portion of the right side of the CD distribution in Bossung curve 215 for the second feature type being at risk for being in a failure zone. Since the Bossung curve of the second feature type 215 before upsizing has a significantly smaller sensitivity to focus variation ($\sigma_2$) as compared to the variation ($\sigma_1$) Bossung curve of the first feature type 210, following disclosed feature upsizing by 1.5σ the upsized Bossing curve of the second feature type 215' shifted by 1.5 $\sigma_2$ receives a relatively small upsize (as compared to the CD shift using 1.5 $\sigma_1$ for the first feature types, resulting in the target $CD_2 + 1.5\sigma_2$ relatively close to the original target $CD_2$.

Figure 2B:
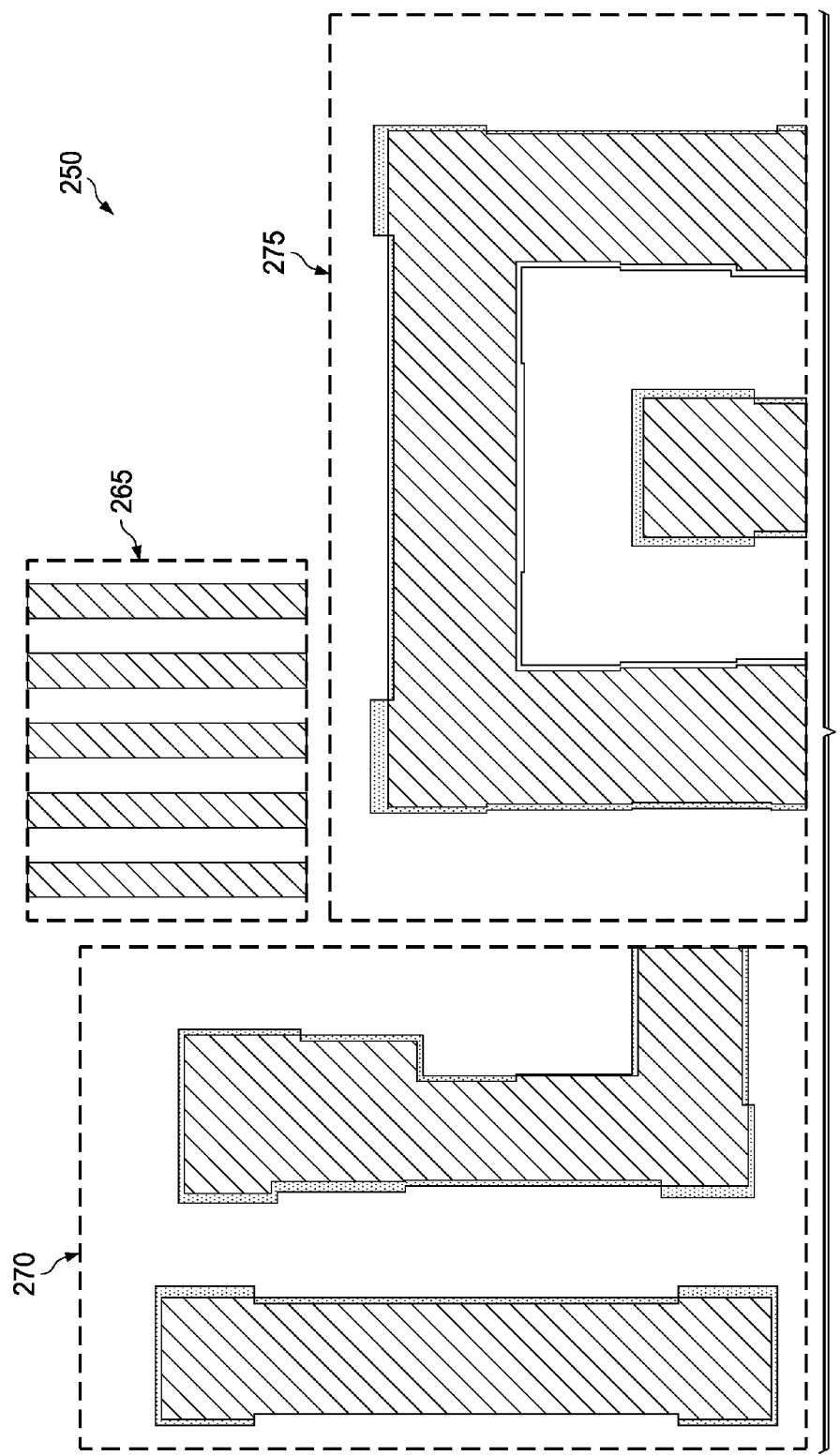
FIG. 2B shows a portion of a reticle for metal interconnect after disclosed feature upsizing responsive to a finding at least one marginal feature is present. For the features, the CL model was run using $1.5\sigma$ off-focus for upsizing the feature types, according to an example embodiment.

FIG. 2B show a portion of a reticle 250 for metal interconnect after disclosed feature upsizing responsive to a finding of at least one marginal features is present. For the features, the CL model was run using 1.5σ off-focus for all the respective feature types. Region 265 includes dense features (lines) which have a relatively low focus sensitivity (no lines are edge lines despite what is shown), and thus as shown in FIG. 2B do not receive any significant upsizing due low σ using disclosed upsizing. Regions 270 and 275 which include a plurality of feature types were determined to include feature types having relatively high focus sensitivity (σ), with disclosed feature upsizing reflected in the significant CD size changes shown, such as for the line-ends and corners which have been found to be focus sensitive.

Figure 3:
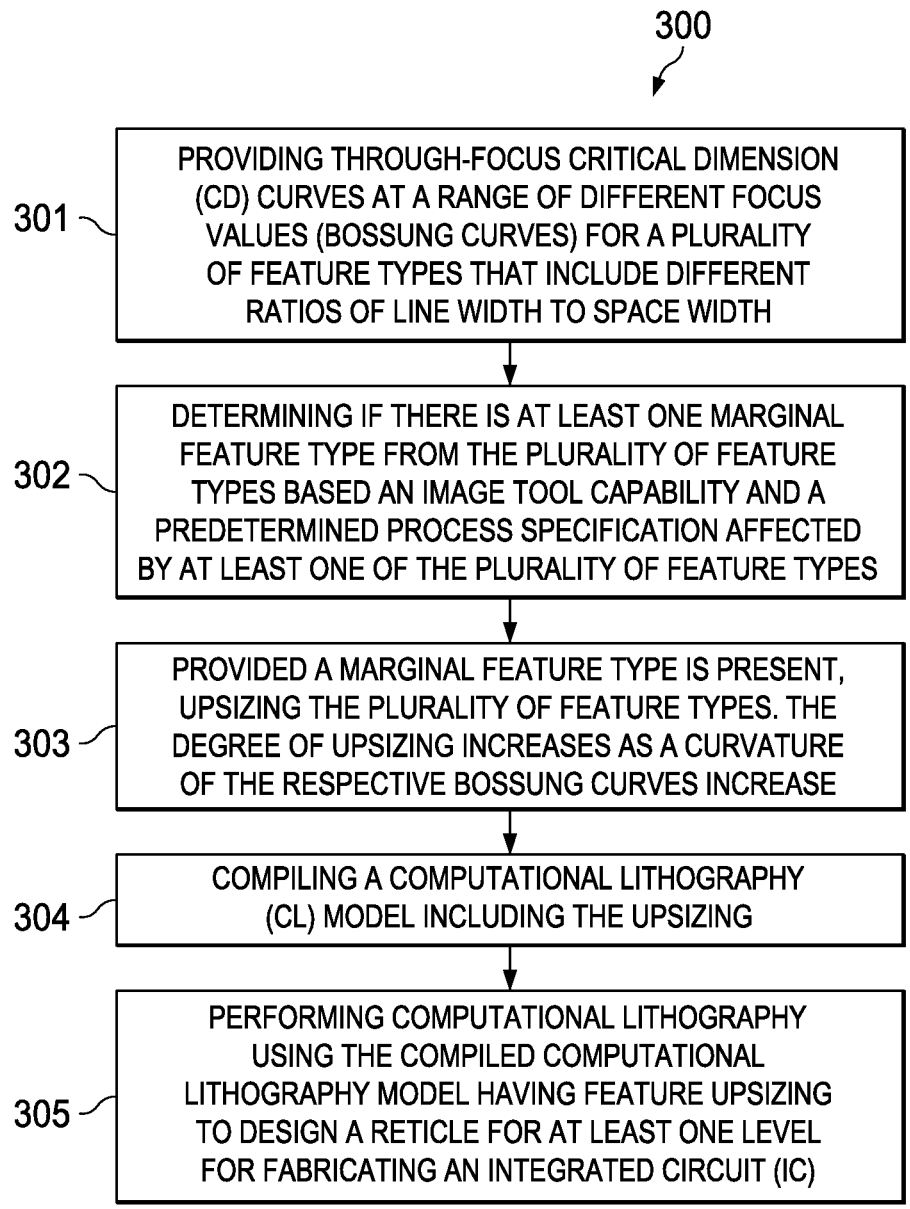
FIG. 3 is a flow chart that shows steps in an example method of CL including incorporating a process window model including a plurality of different feature types, wherein if any marginal feature(s) are determined to be present, the feature types are upsized, according to an example embodiment.

FIG. 3 is a flow chart that shows steps in an example method of CL modeling 300 including upsizing feature types responsive to a finding at least one marginal feature is present, according to an example embodiment. Step 301 comprises providing through-focus CD curves at a range of different focus values (Bossung curves) for a plurality of feature types that include different ratios of line width to space width. A test structure is generally provided to obtain the data having resist on a substrate using a mask including a set of gratings (lines or spaces) which provide a plurality of feature types including different pitches. The CD data can be inline or simulated data, and although generally post-develop resist data. The CD data can also be post etch in the case of a zero bias etch.

The method can optionally include providing CD versus pitch curves including a plurality of pitch values for said plurality of feature types (see FIG. 1A and FIG. 1D), and weighting discrete points of the CD versus pitch curves using a weighting algorithm (WA) that assigns cost weights to the discrete points based on a magnitude of their variation with respect to a reference variance (typically the smallest variance for the plurality of pitch values) to provide weighted CD versus pitch data. The WA algorithm is operable to reduce a value of the cost weights as the magnitude of the variation increases. Bossung curves can then be generated using the weighted CD versus pitch data for each of the pitch values.

A computing device generally including a processor and associated non-transitory memory which stores a disclosed upsizing algorithm, such as read on memory (ROM) or random access memory (RAM) (e.g., static RAM (SRAM)), can be also be used for the data weighting described above, as well as steps 102-105 described below. The WA can be an inverse weight algorithm (IWA), where the IWA algorithm assigns the cost weights to the discrete points as an inverse proportion to the magnitude of their variation with respect to a reference variance.

Step 302 comprises using software run on a computing device, determining if there is at least one marginal feature type from the plurality of feature types based an image tool capability and a predetermined process specification affected by at least one of the plurality of feature types. The predetermined process specification can comprise an electrical parameter (e.g., drive current for a MOS transistor), a CD distribution (e.g., CD size range or σ), or a depth of field (DOF).

Step 303 comprises provided a marginal feature type is present, upsizing at least the marginal feature type. In another embodiment, all of the plurality of feature types are upsized. The degree of upsizing increases as a curvature of the respective Bossung curves increase. The upsizing can comprise selecting a degree upsizing to center a mean of a distribution of a circuit parameter (e.g., resistance, capacitance, drive current, $h_{fe}$ (bipolar gain) for a bipolar) of a circuit element including the marginal feature type to obtain a target mean value for the circuit parameter. The degree of upsizing can be in a range from 0.5σ to 2.0σ for the feature types upsized.

Step 304 comprises compiling a computational lithography (CL) model including the upsizing, such as at a 0.5σ to 2.0σ condition. Step 305 comprises performing computational lithography using the compiled computational lithography model having feature upsizing to design a reticle for at least one level for fabricating an IC.

Disclosed methods may be compared to conventional upsizing of marginal features using Resolution Enhancement Technology (RET) (e.g., Selective Size Adjust (SSA)), that addresses this problem by calculation of marginal features correction during recipe execution for retargeting before running the OPC code. Disclosed embodiments solve the same problem by instead re-centering the CD vs. focus distribution in the CL model itself, thus not incurring the additional RET cost, so that no additional run-time evaluation or corrections needed.

EXAMPLES

Disclosed embodiments are further illustrated by the following specific Examples, which should not be construed as limiting the scope or content of this Disclosure in any way. Example method steps are now provided for one particular disclosed CL with feature upsizing method. Representative inline through-focus CD data (Bossung curves) is collected from different feature types having different pitches. The feature types may include dense pitch, semi-dense pitch, and isolated pitch.

As described above, the method can further include providing CD versus pitch curves at a plurality of pitch values for the plurality of feature types (see FIG. 1A and FIG. 1D), and weighting discrete points of the CD versus pitch curves using a weighting algorithm (WA) that assigns cost weights to the discrete points based on a magnitude of their variation with respect to a reference variance (e.g., the smallest variance for the plurality of pitch values) to provide weighted CD versus pitch data. The WA algorithm is operable to reduce a value of the cost weights as the magnitude of the variation increases. Bossung curves can then be generated using the weighted CD versus pitch data for each of the pitch values.

Scaled weights can improve the regression process to form the Cl model. In another weighting example, a predefined acceptable Focus Range (DOF or depth of field) may be defined. The feature type having a Maximum DOF may be assigned a weight of 1. Scaled weights Wt(f) can then be assigned for the data at off-focus conditions, such as in one particular example based on the Mack formula (see Mack, Jug & Legband SPIE Vol. 3677 (99)):

$$Wt(f) = \exp(-(F-F_0)^2/2 * s_F)$$

where $F_0 = (Fmax+Fmin)/2$, $F_0 = (Fmax+Fmin)/2$, and $S_F$ stands for σ focus.

Data from the feature types can be reweighted that have a DOF<a predetermined DOF on a declining scaled basis. Features larger that the critical width feature can be scaled on a declining scale. This can create a process window data-set for all features using an Inverse Weight Algorithm (IWA). As used herein, a process window (PW) refers to lithographic processes generally need to be evaluated by their process window or, more precisely, by the common process window of all relevant structures. The size of the process window (PW) is commonly measured by an area in exposure-defocus (E-D) space over which variations in the CD or edge placement fall within an allowable range. See "The Exposure-Defocus Forest," B. J. Lin, Jpn. J. Appl. Phys. 33, 6756 (1994). Process window analysis takes into account that any actual manufacturing process is subject to unavoidable variations of real parameter values, such as exposure dose and focus settings of the lithographic projection system. The common process window of all structures on a device design defines the process margin, i.e., the tolerance against process parameter variations.

The CL model can be calibrated (aerial image/defocus parameters extracted) using the weighted discrete data in the CD versus pitch curves at each of the pitch values (e.g., see FIG. 1A and FIG. 1D) using a weighting algorithm, such as using an IWA, and then using the CL model to generate the Bossung curves at each of the pitch values. An off-focus condition, typically a $0.5\sigma$ to $2.0\sigma$ of a $\sigma$ for a Bossung curve (e.g., at $1.5\sigma$ off-focus condition) can be determined based on a given imaging tool capability and a predetermined process specification. to re-center the parametric distribution affected by the marginal feature type(s). The CL model can then be output at the upsized condition for at least the marginal features in the IC design.

Figure 4A:
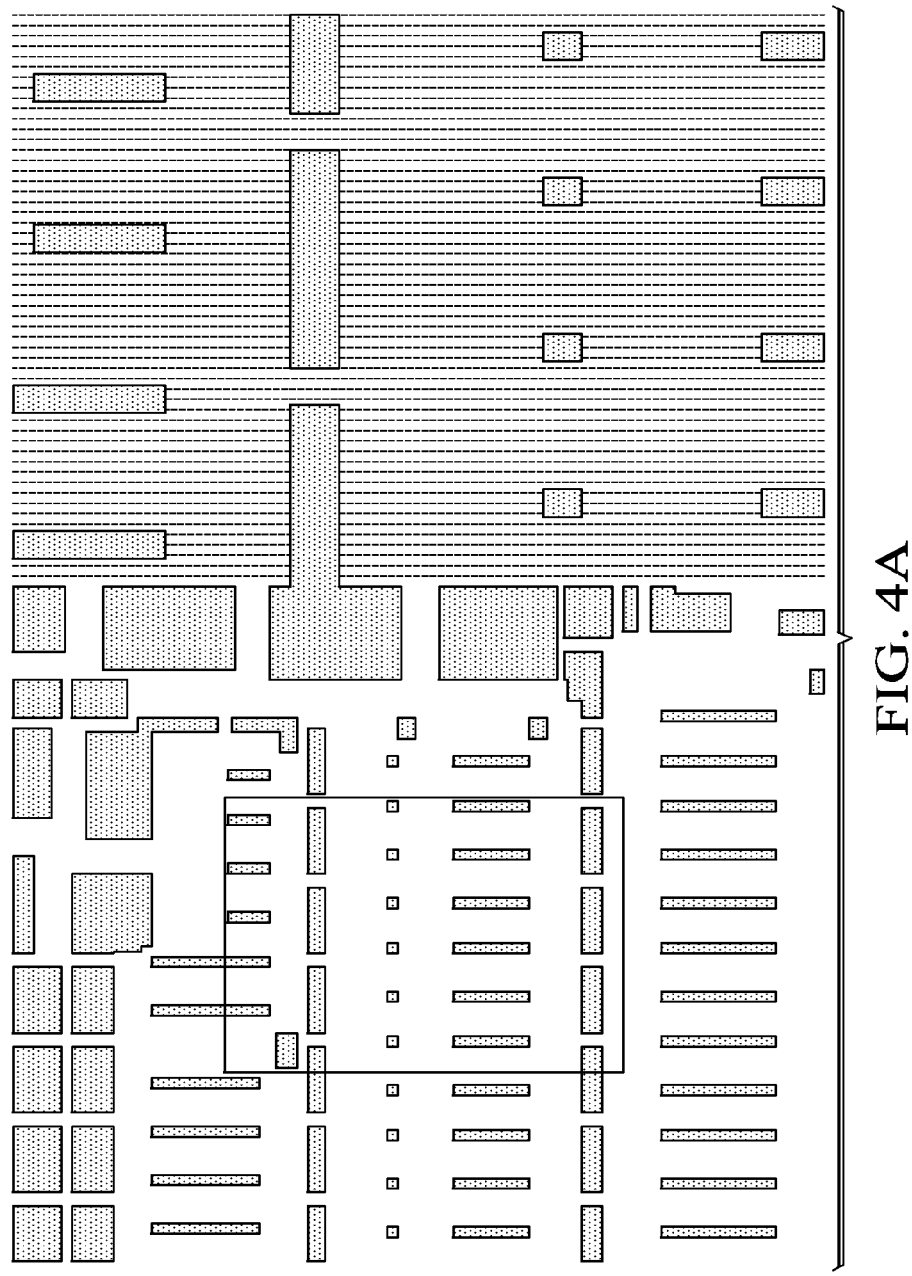
FIG. 4A shows a portion of an example reticle having an added the box shown that includes the portion of the reticle which forms the basis of what is shown in the scanned images in FIG. 4B and FIG. 4C, with FIG. 4B showing scanned printed resist pattern results using a lithograph system having an insufficient DOF to successfully print all of the small square resist features, with FIG. 4C showing the scanned printed resist pattern results after the reticle in FIG. 4A was upsized according to an example embodiment, using the same lithograph system now having sufficient DOF as evidenced by the successfully printing of all of the small square resist features.
Figure 4B:
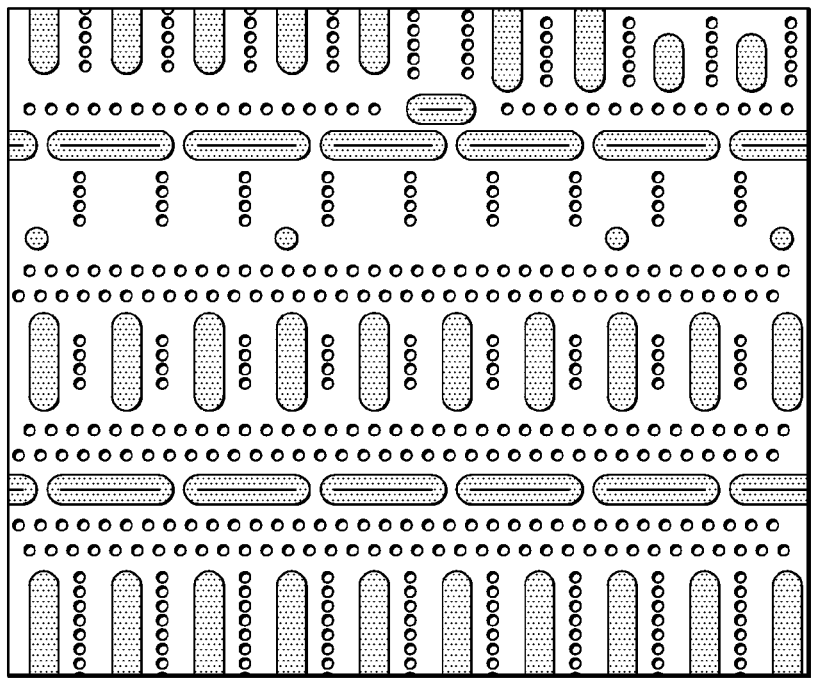
Figure 4C:
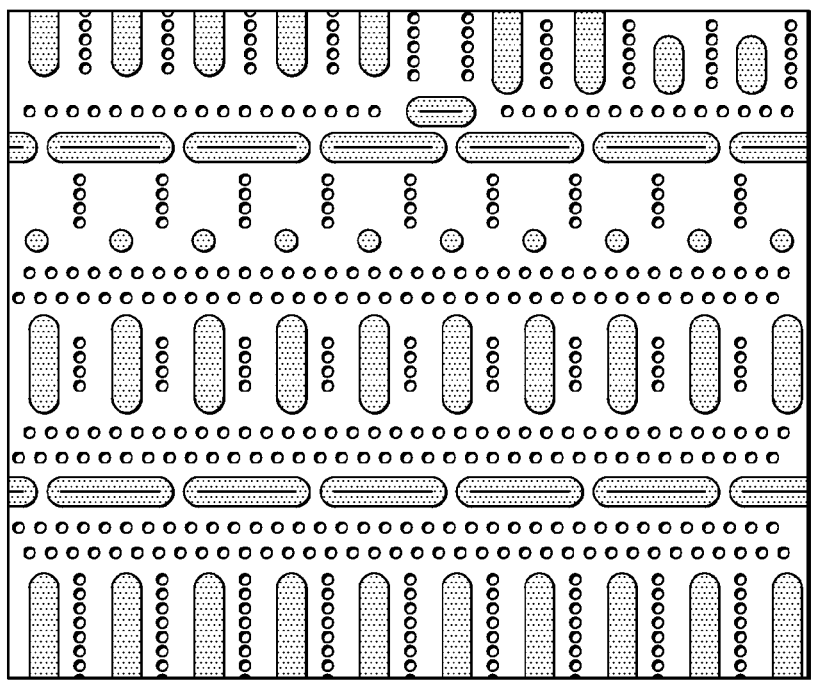

FIG. 4A shows a portion of an example reticle having an added the box that includes the portion of the reticule which forms the basis of what is shown in the scanned images in FIG. 4B and FIG. 4C. FIG. 4B shows printed resist pattern results using a lithograph system having insufficient DOF to successfully print all of the small square resist features, where lifting resist is shown to lead to the missing of 6 square resist features. The reticle in FIG. 4A was upsized $1.5\sigma$, which resulted in an increase the size of the small square resist features around 4% (corresponding to $1.5\sigma$ of the Bossung curve determined earlier for the small square resist features). FIG. 4C shows printed resist pattern results using the same lithograph system with the upsized reticle now having sufficient DOF to successfully print all of the small square resist features, now showing all 10 square resist features successfully printed.

Disclosed embodiments can be used for a variety of lithography systems to form semiconductor devices that may include various elements therein and/or layers thereon, including barrier layers, dielectric layers, device structures, active elements and passive elements including source regions, drain regions, bit lines, bases, emitters, collectors, conductive lines, conductive vias, etc. Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of computational lithography, comprising:
providing through-focus critical dimension (CD) curves at a range of different focus values (Bossung curves) for a plurality of feature types that include different ratios of line width to space width, and
using software run on a computing device;
determining if there is at least one marginal feature type from said plurality of feature types based an image tool capability and a predetermined process specification affected by at least one of said plurality of feature types;
provided said marginal feature type is determined to be present, upsizing at least said marginal feature type, wherein a degree of said upsizing increases as a curvature of said Bossung curves increases,
compiling a computational lithography model including said upsizing, wherein said upsizing comprises selecting said degree of said upsizing to center a mean of a distribution of a circuit parameter of a circuit element including said marginal feature type to obtain a target mean value for said circuit parameter.

2. The method of claim 1, wherein said degree of said upsizing is in a range from $0.5\sigma$ to $2.0\sigma$ for respective ones of said Bossung curves each of said plurality of feature types.

3. A method of computational lithography, comprising:
providing through-focus critical dimension (CD) curves at a range of different focus values (Bossung curves) for a plurality of feature types that include different ratios of line width to space width, and
using software run on a computing device;
determining if there is at least one marginal feature type from said plurality of feature types based an image tool capability and a predetermined process specification affected by at least one of said plurality of feature types;
provided said marginal feature type is determined to be present, upsizing at least said marginal feature type, wherein a degree of said upsizing increases as a curvature of said Bossung curves increases,
compiling a computational lithography model including said upsizing;
providing CD versus pitch curves at a plurality of pitch values for said plurality of feature types,
weighting discrete points of said CD versus pitch curves using a weighting algorithm (WA) that assigns cost weights to said discrete points based on a magnitude of their variation with respect to a reference variance to provide weighted CD versus pitch data, wherein said WA algorithm reduces a value of said cost weights as said magnitude of said variation increases, and
generating said Bossung curves using said weighted CD versus pitch data for each of said pitch values.

4. The method of claim 3, wherein said WA is an inverse weight algorithm (IWA), said IWA algorithm assigning said cost weights as an inverse proportion to said magnitude of said variation.

5. The method of claim 1, further comprising performing computational lithography using said computational lithography model to design a reticle for at least one level for fabricating an integrated circuit (IC).

6. The method of claim 1, wherein said predetermined process specification comprises an electrical parameter.

7. The method of claim 1, wherein said predetermined process specification comprises a distribution of said CD.

8. The method of claim 1, wherein said predetermined process specification comprises a depth of field (DOF).

9. The method of claim 1, wherein said upsizing upsizes all of said plurality of feature types.

10. A computer program product, comprising:
executable code transportable by a non-transitory machine readable medium, wherein execution of said code by at least one programmable computer causes said programmable computer to perform a sequence of steps for a computational lithography process for a lithography system, said sequence of steps comprising:
- determining if there is at least one marginal feature types from through-focus critical dimension (CD) curves at a range of different focus values (Bossung curves) for a plurality of feature types that include different ratios of line width to space width;
- determining if there is at least one marginal feature type from said plurality of feature types based on an image tool capability and a predetermined process specification affected by at least one of said plurality of feature types;
- provided said marginal feature type is determined to be present, upsizing at least said marginal feature type, wherein a degree of said upsizing increases as a curvature of said Bossung curves increases, and
- compiling a computational lithography model including said upsizing, wherein said upsizing comprises selecting said degree of said upsizing to center a mean of a distribution of a circuit parameter of a circuit element including said marginal feature type to obtain a target mean value for said circuit parameter.

11. The computer program product of claim 10, wherein said predetermined process specification comprises an electrical parameter.

12. The computer program product of claim 10, wherein said predetermined process specification comprises a distribution of said CD.

13. The computer program product of claim 10, wherein said predetermined process specification comprises a depth of field (DOF).

14. The computer program product of claim 10, wherein said degree of said upsizing is in a range from $0.5\sigma$ to $2.0\sigma$ for respective ones of said Bossung curves each of said plurality of feature types.

15. The computer program product of claim 10, wherein said upsizing upsizes all of said plurality of feature types.

16. The computer program product of claim 10, wherein said sequence of steps further comprises:
- providing CD versus pitch curves at a plurality of pitch values for said plurality of feature types,
- weighting discrete points of said CD versus pitch curves using a weighting algorithm (WA) that assigns cost weights to said discrete points based on a magnitude of their variation with respect to a reference variance (smallest variance for said plurality of pitch values) to provide weighted CD versus pitch data, wherein said WA algorithm reduces a value of said cost weights as said magnitude of said variation increases, and
- generating said Bossung curves using said weighted CD versus pitch data for each of said pitch values.

17. The computer program product of claim 16, wherein said WA is an inverse weight algorithm (IWA), said IWA algorithm assigning said cost weights as an inverse proportion to said magnitude of said variation.

18. The computer program product of claim 10, wherein said sequence of steps further comprises performing computational lithography using said computational lithography model to design a reticle for at least one level for fabricating an integrated circuit (IC).

* * * * *